US008352829B1

(12) United States Patent
Pathakota

(10) Patent No.: US 8,352,829 B1
(45) Date of Patent: Jan. 8, 2013

(54) REGENERATION OF A PACKET CRC

(75) Inventor: Ravi Pathakota, Bangalore (IN)

(73) Assignee: Juniper Networks, Inc., Sunnyvale, CA (US)

( * ) Notice: Subject to any disclaimer, the term of this patent is extended or adjusted under 35 U.S.C. 154(b) by 675 days.

(21) Appl. No.: 12/539,684

(22) Filed: Aug. 12, 2009

Related U.S. Application Data

(60) Provisional application No. 61/183,384, filed on Jun. 2, 2009.

(51) Int. Cl.
*H03M 13/00* (2006.01)
(52) U.S. Cl. ........................................ 714/758
(58) Field of Classification Search .................. 714/758, 714/781
See application file for complete search history.

(56) References Cited

U.S. PATENT DOCUMENTS

| | | | | |
|---|---|---|---|---|
| 5,910,182 A * | 6/1999 | Dent et al. | ...... | 714/786 |
| 6,530,057 B1 * | 3/2003 | Kimmitt | ...... | 714/758 |
| 6,560,742 B1 * | 5/2003 | Dubey et al. | ...... | 714/757 |
| 6,820,232 B2 * | 11/2004 | Kim et al. | ...... | 714/781 |
| 6,865,708 B2 * | 3/2005 | Wang | ...... | 714/758 |
| 6,904,558 B2 * | 6/2005 | Cavanna et al. | ...... | 714/781 |
| 6,996,158 B2 * | 2/2006 | Bradley | ...... | 375/148 |
| 7,047,479 B1 * | 5/2006 | Hagh-Panah et al. | ...... | 714/774 |
| 7,184,437 B1 | 2/2007 | Cole et al. | | |
| 7,225,387 B2 * | 5/2007 | Lin et al. | ...... | 714/758 |
| 7,363,574 B1 * | 4/2008 | Maitland et al. | ...... | 714/759 |
| 7,543,214 B2 * | 6/2009 | Ricci | ...... | 714/758 |
| 7,729,322 B2 * | 6/2010 | Abrol et al. | ...... | 370/338 |
| 2005/0086571 A1 * | 4/2005 | Farnsworth | ...... | 714/758 |
| 2005/0097432 A1 * | 5/2005 | Obuchi et al. | ...... | 714/800 |
| 2008/0044181 A1 | 2/2008 | Sindhu | | |
| 2008/0154998 A1 * | 6/2008 | Ikeda | ...... | 708/210 |
| 2010/0125777 A1 * | 5/2010 | Wang et al. | ...... | 714/807 |
| 2012/0002631 A1 * | 1/2012 | Nishio et al. | ...... | 370/329 |

OTHER PUBLICATIONS

U.S. Appl. No. 11/835,923, entitled "Identifying Application for Intrusion Detection Systems," filed Aug. 8, 2007.
U.S. Appl. No. 12/271.605, entitled "Routing Device Having Integrated MPLS-Aware Firewall," filed Nov. 14, 2008.

* cited by examiner

*Primary Examiner* — James C Kerveros
(74) *Attorney, Agent, or Firm* — Shumaker & Sieffert, P.A.

(57) ABSTRACT

Techniques relate to the regeneration of a cyclical redundancy check (CRC) value of a data packet in a manner that avoids a complete CRC recomputation based on the entire packet after only a portion of a packet has been modified. When modifying and forwarding a packet, a network device identifies only the changed portions of a packet and computes an updated CRC for the packet based on the original CRC, the modified portions, and the length from the modified field to end of packet.

15 Claims, 4 Drawing Sheets

REGENERATION OF A PACKET CRC

This application claims the benefit of U.S. Provisional Application No. 61/183,384, entitled, "REGENERATION OF A PACKET CRC," and filed on Jun. 2, 2009, the entire content of which is incorporated herein by reference.

TECHNICAL FIELD

The invention relates to error detection in packets transmitted over a network, and in particular, to the calculation of a cyclical redundancy check (CRC) in a packet.

BACKGROUND

Electrical signals transmitted over a communication channel are subject to noise and interference from a number of sources, including other electrical signals as well as the channel itself, for example. Digital data is no exception. To overcome the inherent inaccuracy of information transmission, error detection methods are developed. One of the common methods is the use of the cyclic redundancy check (CRC) function.

Digital data to be transmitted over a network, such as the Internet, may be formatted into packets prior to transmission. A packet typically includes the data, or payload, to be transmitted, along with information necessary to route the packet from a source to a destination. Such information may be placed in a packet header and include a network address of the source device and a network address of the destination device, with a CRC appended at the end of the message At the time of transmission, the transmitting device typically calculates the CRC from the bits in the header and the payload and then appends the CRC to the end of the packet following the payload. After the packet has been transmitted and received by the destination device, the destination device recomputes the CRC from the received bits in the header and the payload of the packet. Then, the destination device compares the recomputed CRC against the CRC that was sent with the packet. If there is any difference between the two CRCs, an error has occurred during transmission.

Because of the nature of the Internet, packets sent from a source device have numerous routes available in order to reach a destination device. Oftentimes it is necessary for a packet to be re-routed during transmission by an intermediate node within the network, however, due to a network's need to balance packet flows across multiple destinations, or when a device is acting as a proxy, for example. Such re-routing may result in a change to a packet's header. However, because the original CRC was computed based on the bits in the original header, the intermediate device needs to recompute the packet CRC in order to reflect the changes in the header.

Traditionally, if there is a change to a packet, the intermediate device would read the entire packet, including the unchanged payload, and recompute the CRC. In order to recompute the CRC for the entire packet, complete CRC computation logic is needed, thus requiring numerous logic gates and thus a large footprint. Furthermore, the CRC computation logic must be active during the complete fetch of the packet data, which may take a number of clock cycles. Due to the complexity of CRC computation logic, the implementation may be pipelined to meet the timing, thereby introducing a few clock cycles of latency to the design. Further, because of the large number of exclusive-OR (XOR) gates typically used in the design, for each clock cycle there may be numerous bit toggles, depending on the change in input data to the CRC computation logic and hence there is high probability of one or more glitches.

SUMMARY

In general, techniques are described herein that relate to the regeneration of a cyclical redundancy check (CRC) value of a data packet in a manner that avoids a complete CRC recomputation based on the entire packet after only a portion of a packet (e.g., a portion of the packet header) has been modified. For example, techniques are described herein in which, when modifying and forwarding a packet, a network device identifies only the changed portions of a packet and computes an updated CRC for the packet based on the original CRC and the modified portions.

Further, techniques are described herein that relate to pre-computation of CRCs for definite sized bits and storage of those pre-computed CRCs in a network device for efficient CRC regeneration. Techniques are also described herein in which pre-computed CRCs are selected and multiplied together with modified field and used by the network device along with an original CRC of a packet in order to efficiently calculate an updated CRC for the packet when modified by the network device.

In one embodiment, techniques of this disclosure are directed to a network device. The network device comprises a set of one or more network interfaces, memory, CRC selection circuitry, first addition circuitry, second addition circuitry, multiplier circuitry, CRC computation circuitry, and a forwarding component. The set of one or more network interfaces receives a packet from a network, the packet including an original group of bits and an original cyclical redundancy check (CRC) associated with the original group of bits. The memory stores a plurality of pre-computed CRCs. The CRC selection circuitry selects at least one of the plurality of pre-computed CRCs, the CRC selection circuitry being in electrical communication with the memory. The first addition circuitry receives an original group of bits of the packet and a modified version of the group of bits and performs a first addition operation on the original group of bits and the modified version of the group of bits to produce a first addition operation output, the original group of bits differing from the modified version of the group of bits. The multiplier circuitry multiplies at least one of the plurality of pre-computed CRCs with the output of the first addition operation on the original group of bits and the modified version of bits, wherein the multiplier produces a multiplier output, and wherein the multiplier is in electrical communication with the memory. The CRC computation circuitry produces a CRC computation circuitry output from the multiplier output, wherein the CRC computation circuitry is in communication with the multiplier circuitry and the first addition circuitry. Second addition circuitry performs a second addition operation on the CRC computation circuitry output and the original CRC associated with the original group of bits of the packet to output a modified CRC associated with the modified version of the group of bits, the second addition circuitry being in communication with the CRC computation circuitry. A forwarding component updates the original CRC of the packet with the modified CRC and outputs the packet to the network via the set of network interfaces.

In another embodiment, techniques of the disclosure are directed to a method that comprises storing a plurality of pre-computed cyclical redundancy check values (CRCs) CRCs, selecting at least one of the plurality of pre-computed CRCs, performing a first addition operation on an original group of bits and a modified version of the group of bits to produce a first addition operation output, the original group of bits differing from the modified version of the group of bits, multiplying at least one of the plurality of pre-computed CRCs with the output of the first addition operation on the original group of bits and the modified version of bits, wherein the multiplier produces a multiplier output, computing a CRC from the multiplier output, performing a second addition operation on the computed CRC and an original CRC associated with the original group of bits of the packet to output a modified CRC associated with the modified version of the group of bits, updating the original CRC of the packet with the modified CRC to form an outbound packet, and outputting the outbound packet to the network.

The techniques described herein may provide certain advantages. For example, the invention may reduce the computational logic that traditionally has been required to compute CRCs. Such a reduction in logic may itself have one or more advantages. A reduction in computational logic may reduce the number of required clock cycles, and consequently, the time needed to compute a CRC. Reducing the time needed to compute a CRC may decrease the delay in forwarding a packet. Furthermore, a reduction in computational logic may reduce the amount of power consumed by the network device. And, in addition to the above-mentioned advantages, a reduction in computational logic may also reduce the probability of a glitch occurring during the CRC computation.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
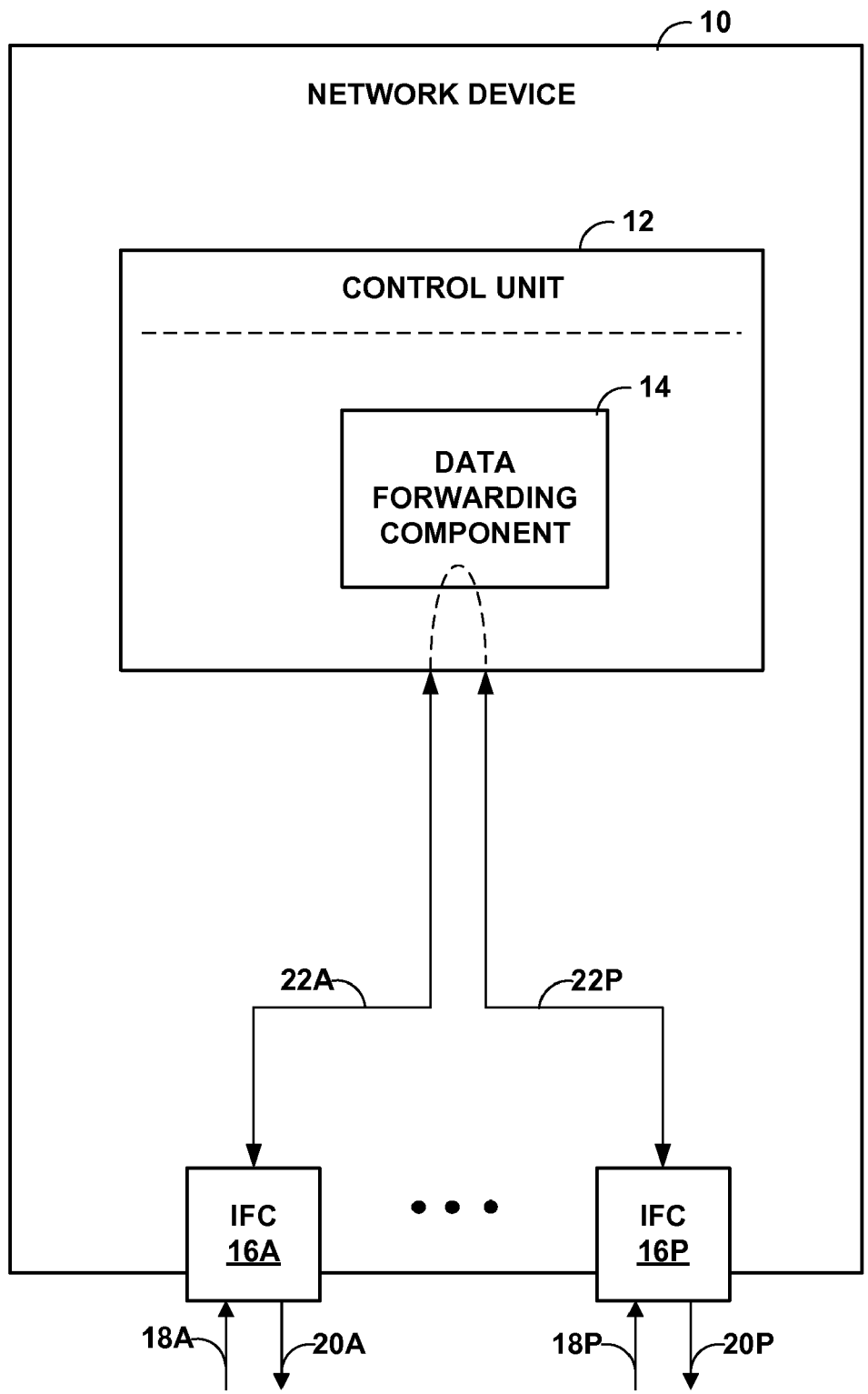
FIG. 1 is a block diagram illustrating an exemplary embodiment of a network device that recomputes CRCs for modified packets consistent with the principles of the invention.

FIG. 1 is a block diagram illustrating an example network device 10 that includes a control unit 12 having a data forwarding component 14, and a set of interface cards 16A-16P (collectively, "IFCs 16") that receive and send packet flows via network links 18A-18P (collectively, "network links 18") and 20A-20P (collectively, "network links 20"), respectively. IFCs 16 are typically coupled to network links 18, 20 via a number of interface ports (not shown), and forward and receive packets and control information from control unit 12 via a respective one of paths 22A-22P (collectively, "paths 22"). Network device 10 may include a chassis (not shown) having a number of slots for receiving a set of cards, including IFCs 16. Each card may be inserted into a corresponding slot of a chassis for communicably coupling the card to a control unit 12 via a bus, backplane, or other electrical communication mechanism.

As shown, control unit 12 includes a data forwarding component 14, which may comprises a forwarding plane having one or more packet-forwarding integrated circuits. For example, network device 10 may be a router and data forwarding component 14 may be a packet forwarding engine that forward packets in accordance with routing information describing a topology of a network. U.S. Pat. No. 7,184,437 provides details on an exemplary embodiment of a router that utilizes a radix tree for storing routing information, the contents of which is incorporated herein by reference in its entirety. Moreover, data forwarding component 14 may be provided by dedicated forwarding integrated circuits normally associated with high-end routing and forwarding components of a network router. U.S. Patent Application 2008/0044181, entitled MULTI-CHASSIS ROUTER WITH MULTIPLEXED OPTICAL INTERCONNECTS, describes a multi-chassis router in which a multi-stage switch fabric, such as a 3-stage Clos switch fabric, is used as a high-end forwarding plane to relay packets between multiple routing nodes of the multi-chassis router. The entire contents of U.S. Patent Application 2008/0044181 are incorporated herein by reference. As a router, network device 10 may modify information within a packet and utilize the techniques herein to efficiently calculate an updated CRC. For example, a router may apply the technique described herein when modifying an MPLS label stack of the packet or when modifying any information within the packet header, e.g., when operating as a proxy for a destination of the packet. As another example, a service plane of a router may apply the technique when applying security services to packet flow. Examples of routing devices having integrated security services are described in U.S. Provisional Patent Application No. 61/088,916, entitled "ROUTING DEVICE HAVING INTEGRATED MPLS-AWARE FIREWALL," filed Aug. 14, 2008, the entire contents of which are incorporated by reference.

In an alternative embodiment, network device 10 may be an intrusion prevention device (IPD) that analyzes packet flows to identify suspicious packet flows. As an IPD, network device 10 may, for example, remove portions of a packet's payload in the event the payload carries multiple, encapsulated communication session and one or more of the sessions has been identified as suspicious. In this case, the IPD may apply the techniques to the modified packet to efficiently generate an updated CRC. Further details of an IPD device are described in U.S. patent application Ser. No. 11/835,923, entitled "IDENTIFYING APPLICATIONS FOR INTRUSION DETECTION SYSTEMS," the entire contents of which are incorporated herein by reference.

In any case, network device may be any intermediate device positioned between a source device and a destination device that may, on occasion, modify a packet transmitted from the source device to the destination device. In this case, as will be described in more detail below with specific reference to FIG. 2, data forwarding component 14 regenerates a cyclical redundancy check (CRC) of the packet in a manner that avoids a complete CRC recomputation based on the entire packet after only a portion of a packet (e.g., a portion of the packet header) has been modified.

In operation, network device 10 receives inbound packets from network links 18, and may perform operations that result in modification to one or more portions of the packets. For example, network device 10 may modify the packet in the event, portions of the packet's payload are suspicious, alter a header of the packet to redirect the packet or operate as a proxy for the packet's destination, alter an MPLS label stack so as to forward the packet in a MPLS network, or otherwise apply any operation that modifies portions of the header and/or the payload of the packet. Accordingly, network device 10 determines whether CRC recomputation is necessary based on any changes to a given packet. If so, network device 10 recomputes the CRC of the packet as needed, reassembles the packet if CRC recomputation was performed, and sends the modified version of the inbound packet out a network link 20. By applying the efficient CRC regeneration techniques described herein without requiring complete CRC recomputation, network device 10 may reduce the number of clock cycles, power, and glitches that oftentimes accompany the traditional method of reading the entire inbound packet and recomputing the CRC, including the unchanged payload.

Figure 2:
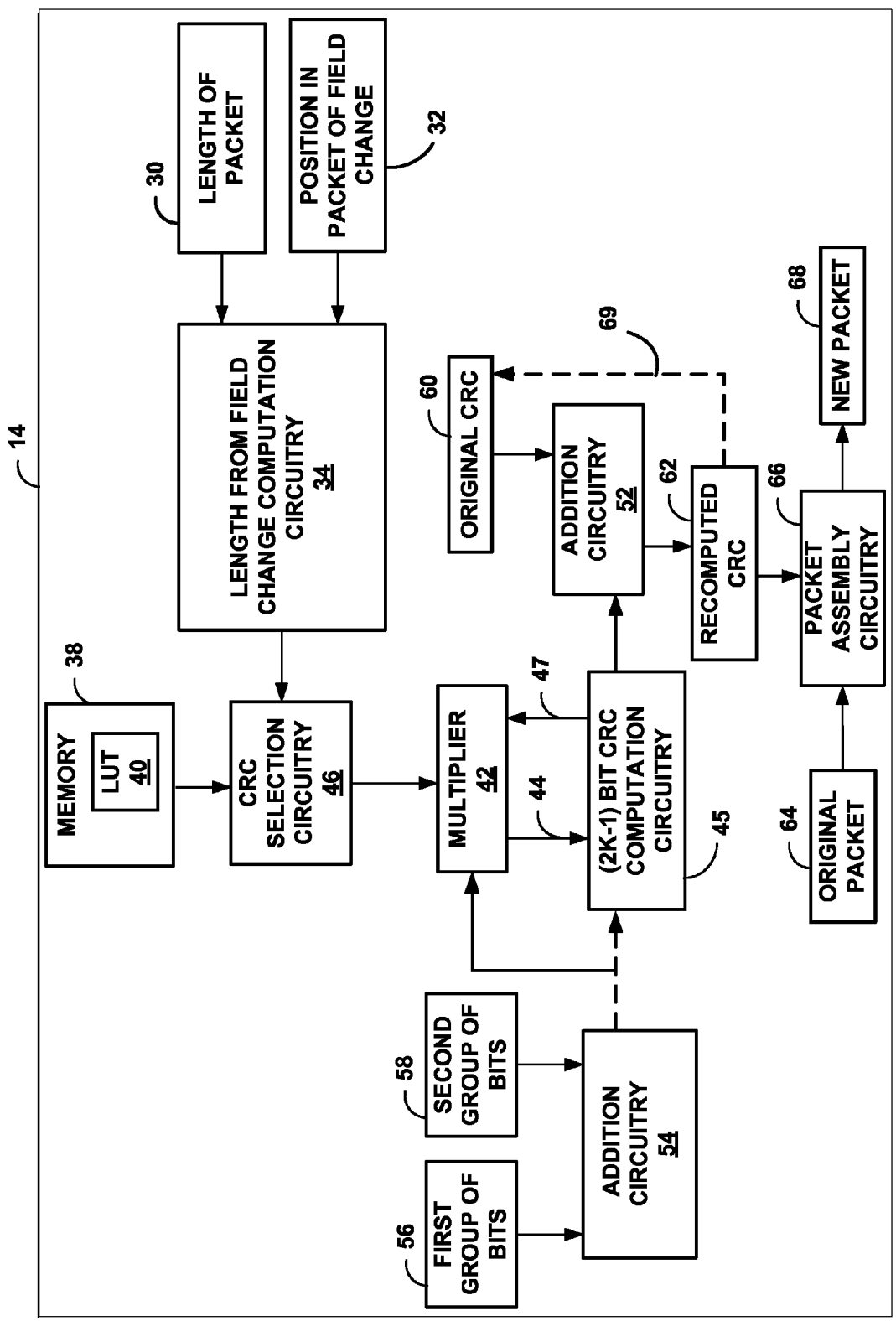
FIG. 2 is a block diagram illustrating an exemplary embodiment of a data forwarding device within the network device shown in FIG. 1 that recomputes CRCs for modified packets consistent with the principles of the invention.

FIG. 2 is a block diagram showing portions of the data forwarding component 14 of FIG. 1 in more detail. The elements of forwarding component 14 shown in FIG. 2 may, by way of example, be implemented as core logic or microcode in one or more packet-forwarding application specific integrated circuit (ASIC) designed to function in accordance with the principles of the invention. Forwarding component 14 typically includes other elements for applying known operations for processing and forwarding packets. Consequently, FIG. 2 only shows elements of forwarding component 14 for dynamic recomputation of a CRC of a packet in the event one or more portions of packet is modified by network device 10.

The standard way of computing a CRC, e.g., as in the case of Ethernet CRCs, is to compute the CRC after complementing the first 32 bits of packet data and appending 32 zeros at the end of the packet. As the degree or order of the CRC polynomial in Ethernet is 32, the first 32 bits of packet data are complemented with 32 zeros appended at the end of the packet. Considering P(X) as the packet polynomial, the standard way of computing the CRC can be represented as CRC $(P^{132}(X)X^{32})$. $P^{132}$ represents that the first 32 bits of packet data are to be complemented. From here on CRC$(P^{132}(X)X^{32})$ is represented as $CRC_s(P(X))$.

From here on to avoid ambiguity with other literature CRC (P(X)) is represented as $CRC_p(P(X))$. Note that $CRC_p(P(X))$ computes the CRC with initial seed as zero and without complementing first k bits and without appending k zeros at end of packet. Here k is the order of the CRC polynomial.

When recomputing a CRC for a modified inbound packet, forwarding component 14 first analyzes the packet in order to determine both the total length of the inbound packet and the position of the field that was modified in the inbound packet.

Once the position of the changed field in the inbound packet has been determined, then the length of the inbound packet, shown at 30, and data (e.g., a bit vector) representing the byte position in the inbound packet for changed field, shown at 32, are input into length from field change computation circuitry 34. Data forwarding component 14 will be aware of the byte position of the field that was modified because a designer, knowing which field will be modified in the packet, hardcoded the byte position in the design. It should be noted that the byte position of the field is considered as starting from the header and hence from the start of the packet. Length from field change computation circuitry 34 includes digital logic circuitry or microcode that compares the length of the inbound packet and the byte position of the modified field in the inbound packet to determine the distance from the position that changed to the end of the packet. That is, length from field change computation circuitry 34 calculates a distance from the bit of the modified packet header that changed to the least significant bit of the packet. This is essentially a subtraction operation. For example, if the inbound packet has a packet length of 1500 bytes and the data in the packet from the header changed at byte 60, then the distance from the position of the data that changed to the end of the packet is 1500−60=1440 bytes. Although some examples use the byte position in the inbound packet of the field change, other examples may use the word position, and still other examples may use multiples of word position. Whether to consider byte position, word position, or multiples of word position is implementation specific and the choice may be left to the designer for optimized implementation. In the case in which the changed field has a size of more than one byte, then the position of the changed field is considered to be the position of the last byte in the modified field from the start of packet.

In at least one embodiment, the distance from the position of the field that changed to the end of the packet may be determined as a multiple of the width of the CRC. For example, if a 32-bit CRC will be used, then the distance from the change in the field will be determined as a multiple of 4 bytes. In the above example, where the distance from the position in the header that changed to the end of the packet was 1440 bytes, the distance is represented as 360 words.

It should be noted that the number of bits in the CRC and the maximum packet length are typically determined when the ASICs, for example, are designed.

Once the distance from the change in field is calculated by circuitry 34 for a given modification to the packet, the bit values in a binary representation of that distance are used in order to retrieve one or more pre-computed CRCs from memory 48.

More specifically, memory 38 stores a set of N pre-computed CRCs that are k-bit wide. In one embodiment, memory 38 may comprise memory devices such as read-only memory (ROM), non-volatile random access memory (NVRAM), electrically erasable programmable read-only memory (EEPROM), FLASH memory, magnetic or optical data storage media, and the like. In at least one embodiment, it may be unnecessary to use ROM or lookup tables (LUT) in the design. Instead, the design may have pre-computed constant CRCs connected to the inputs of CRC selection circuitry 46. A synthesis tool may infer tie cells that have negligible area. Also, the synthesis tool may be used to optimize the area and timing of the decoder in CRC selection circuitry 46. The term "memory" as used throughout this disclosure may refer to memory devices or hardwired implementations of the design.

In one for example, the set of N k-bit CRCs are stored in memory 38 of network device 10 and may be arranged in a lookup table 40. For example, in an Ethernet network where a 32-bit Ethernet polynomial is used for CRC calculation, k=32. The value of N, or the total number of CRCs to be pre-computed and stored, depends on the maximum packet size including CRC that device 10 may support.

The number N is selected such that the N pre-computed CRCs correspond to $CRC_P$ calculated for values of $2^{2^0}, 2^{2^1}, 2^{2^2}, 2^{2^3}, 2^{2^4} \ldots 2^{2^{N-1}}$, where N is the maximum integer that satisfies the condition $2^{|N-1|} < |P|$ where |P| is the maximum packet size in bits including CRC bits the device 10 may support.

CRCs calculated for values of $2^{2^0}, 2^{2^1}, 2^{2^2}, 2^{2^3}, 2^{2^4} \ldots 2^{2^{N-1}}$ are stored in memory 38 or represented by static logic cells having correct bits tied high or low. The particular computation of a CRC depends on the type of CRC used by the protocol by which the packets are being transmitted and is well known to persons of ordinary skill in the art and will not be described herein. Example algorithms are described in A. S. Tanenbaum, Computer Networks, Prentice Hall, 1981, hereby incorporated by reference.

It should be noted that in at least one embodiment, the computing and storing of the CRCs is performed at the site of manufacture of the network device. In some embodiments, the computing and storing is performed during an initialization and boot-up sequence of the network device. Further, "pre-computing" a CRC as used herein means computing a CRC prior to the network device receiving an inbound packet on which computation is to be performed.

As mentioned above, once the length from the change to the end of packet is calculated, the bit values in a binary representation of that length are used in order to determine which pre-computed CRCs need to be multiplied together. This determination is performed by the CRC selection circuitry 46. If the length from the change to the end of packet is 60 (base-10) bytes or 480 bits then the distance represented in binary is 111100000. For a binary representation of 111100000, the MSB is bit 8 and the LSB is bit 0. In accordance with the disclosure, for 32 bit CRC polynomial where k=32, bit position 8 is associated with the CRC pre-computed for $2^{2^{8}}$, bit position 7 is associated with the CRC pre-computed for $2^{2^{7}}$, and bit position 6 is associated with the CRC pre-computed for $2^{2^{6}}$ and so on. Specifically, in the example where the length of the packet from the modified field is b'111100000, CRC selection circuitry 46 accesses memory 38, and in some embodiments, lookup table 40 located therein, and reads out the pre-computed CRC pre-computed for $2^{2^{8}}, 2^{2^{7}}, 2^{2^{6}}, 2^{2^{5}}$ The circuitry of forwarding component 14 provides the output signals of CRC selection circuitry as input signals to multiplier 42. Specifically, multiplier 42 multiplies the pre-computed CRCs together (in the above example, 4 CRCs are multiplied together) along with the output of modulo 2 addition circuitry 54 to produce a multiplier output 44.

Assume that rather than having a length of 60 bytes, as in the example above, the length of the packet from the change in the field is 10 bytes. The binary representation of 10 bytes or 80 bits is 1010000 bits. Because there is a '1' in bit position 6 and bit position 4, two pre-computed CRCs will be multiplied together—for $2^{2^{6}}$ and $2^{2^{4}}$—along with the output of modulo 2 addition circuitry 54 to produce a multiplier output.

In addition, the output of modulo 2 addition circuitry 54 is input into the multiplier circuitry 42. Specifically, a modulo 2 addition operation is performed on the first, or original, group of bits 56 that have changed (e.g. an original portion of a header) and the second, or modified, version of the original group of bits 58 (e.g., the same portion of the header as modified). The Modulo 2 operation is performed only on the bits that have changed in the group of bits (e.g. the destination address in the header). Determining the exact bits that have changed may be accomplished, for example, by using XOR circuitry as discussed above. In some embodiments, the XOR circuitry that was used to determine the position in the inbound packet of one or more bit changes at 32 may be used.

Pre-computed CRCs are of k bit wide. Multiplying 2 pre-computed CRCs of k bit wide results in product of 2k−1 bit wide. Note that the multiplier operation is based on Modulo 2 arithmetic. If more than one pre-computed CRCs are to be multiplied along with the output of the Modulo 2 addition circuitry, then for each multiplication iteration, the bit width of the product increases by k−1 bits where k is the order of the CRC polynomial. Instead of using the product as one of the input operands for the multiplier in the next multiplication iteration, the multiplier output of 2k−1 bit wide can be reduced to k bits using (2k−1) bit CRC computation circuitry 45.

Multiplier output 44 is input into (2k−1) bit CRC computation logic 45 to compute the CRC for 2k−1 bits. The output 47 of CRC computation logic 45, which has bit width k, is fed back to multiplier 42 for multiplication with other pre-computed CRCs, as needed. If the output of modulo 2 addition circuitry 54 has a bit width greater than k, then the output of modulo 2 addition circuitry 54 is fed first to CRC computation logic 45 to compute the CRC and then the resultant CRC is fed to multiplier circuitry 42 for multiplication with the pre-computed CRCs, as needed.

Further, the CRC of the original packet, or the original CRC 60, is provided as an input to Modulo 2 addition circuitry 52. Addition circuitry 52 performs a Modulo 2 addition of the inputs and produces a recomputed CRC 62. In this way, recomputed CRC 62 is based on the original CRC, the selected set of pre-computed CRCs, the modified portion of the packet, and the corresponding original portion of the packet.

Finally, recomputed CRC 62 and modified packet 64 containing the original CRC are provided as inputs to packet assembly circuitry 66 in order to produce a new packet 68. That is, the recomputed CRC replaces the original CRC at the end of the original packet 64 to produce new packet 68. Data forwarding component 14 may now proceed to forward new packet 68 out network link 20.

If there were multiple field changes to the packet, it may be necessary to perform the operations described above with respect to FIG. 2 multiple times. For example, if there were two field changes to the packet, a recomputed CRC based on the first field change is determined in the manner described above. However, before the packet assembly circuitry 66 is used to produce a new packet, the recomputed CRC 62 is fed back to original CRC 60 via feedback loop 69 and becomes the "original" CRC for the next iteration. Then, in the manner described above, a recomputed CRC is determined based on the second field change.

In some examples, however, it may not be necessary to perform multiple iterations for multiple bit changes. Depending on the size of modified fields and where they are placed in frame, one can go for optimum solution of treating the entire data stream starting from first field change to end of last field change as one changed bits/bytes/words and apply CRC regeneration logic.

While embodiments of the present invention may be performed using circuitry, as described above, it should also be noted that combinations of software, firmware and microcode may also be used in order to perform the CRC recomputation. For example, forwarding component 14 may operate according to executable instructions fetched from one or more computer-readable media. Examples of such media include random access memory (RAM), read-only memory (ROM), non-volatile random access memory (NVRAM), electrically erasable programmable read-only memory (EEPROM), flash memory, and the like. The functions of forwarding component 14 may be implemented by executing the instructions of the computer-readable medium with one or more processors, discrete hardware circuitry, firmware, software executing on a programmable processor, or a combination of any of the above.

Figure 3:
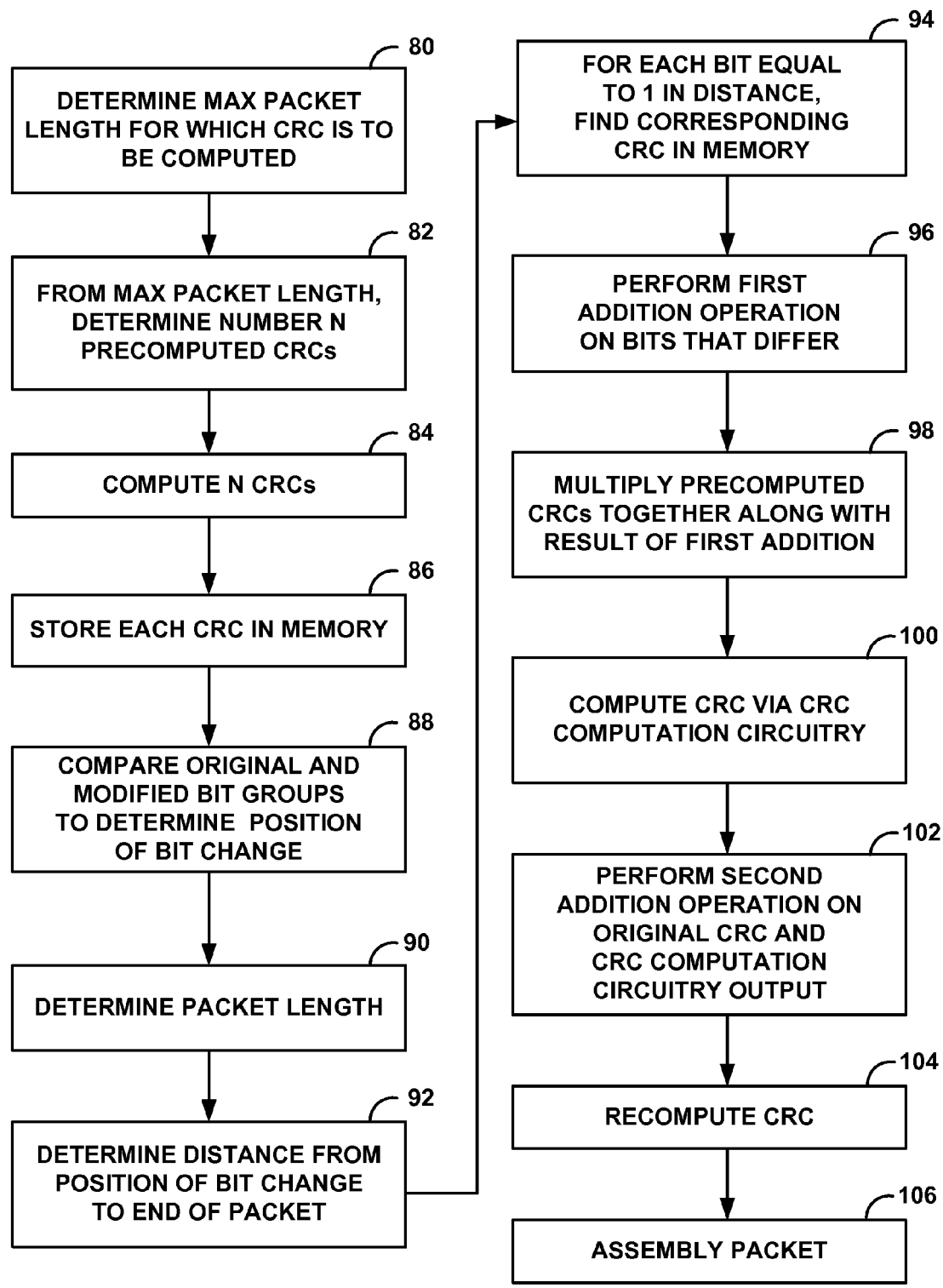
FIG. 3 is a flow diagram illustrating an exemplary method for regenerating a packet CRC in a network device consistent with the principles of the invention.

FIG. 3 is a flow diagram illustrating an exemplary method of operation of a network device when regenerating a packet CRC in accordance with the principles herein. For exemplary purposes, the flow diagram of FIG. 3 will be explained in reference to FIGS. 1 and 2.

Initially, and typically at the design stage of an ASIC, for example, the designer determines the maximum packet length for which an k-bit CRC is to be computed (80). For Ethernet packets, the maximum packet length is 1518 bytes including CRC bytes, although for jumbo packets it can be as much as 9 k. Also typically performed at the design stage of an ASIC is the determination of how many bits the CRC should have (80). For example, a CRC for Ethernet packets conventionally has 32 bits. Next, from the maximum packet length including CRC bits, the number N of pre-computed k-bit wide CRCs is determined (82).

As explained, these N CRCs values are k bits each and are calculated, respectively, for $2^{2^0}$, $2^{2^1}$, $2^{2^2}$, $2^{2^3}$ and so forth to $2^{2^{N-1}}$. $CRC_P$ of $2^{2^0}$, $2^{2^1}$, $2^{2^2}$, $2^{2^3}$ is then computed (84) and stored in memory (86). This may, for example, occur during the design phase of data forwarding component 14, e.g., when a designer determines the schematic layout of one or more ASIC so to create an accessible table or other structure of CRCs storing the pre-computed CRCs. Alternatively, this may occur at boot-time of the network device.

In any case, in operation, an inbound packet reaches data forwarding component 14 for processing and forwarding. After processing the packet, forwarding component 14 compares the original group of bits to the modified version of the original group of bits to determine the position(s) of the bit change (88). In some cases, forwarding component 14 may not perform this step in the event control logic within forwarding component already knows which portions of the packet, if any, have been changed during previous processing. The length of the inbound packet is also determined (90).

From the byte position of the bit change (88) and the length of the inbound packet (90), the distance from the position that changed to the end of the packet determined (92) by circuitry 34. For each bit equal to '1' in a binary representation of the distance from the position that changed to the end of the packet, CRC selection circuitry 36 queries memory 38, and in some embodiments lookup table 40, for the corresponding pre-computed CRC (94).

Next, a Modulo 2 addition operation is performed only on words that contain bits that differ between the original group of bits and the modified group of bits (96) by addition circuitry 54. As mentioned above, the Modulo 2 addition operation may be performed by XOR circuitry.

The circuitry of forwarding component 14 then provides the output signals of CRC selection circuitry 36 as input signals to multiplier 42. Specifically, multiplier 54 multiplies the pre-computed CRCs together along with the output of modulo 2 addition circuitry 54 to produce a multiplier output 44 (98). CRC computation circuitry 45 computes a CRC of multiplier output 44 (100). As previously mentioned, the width of the multiplier output will increase by k−1 bits for each multiplication of pre-computed CRCs, and can be reduced to k bits by performing CRC using CRC computation circuitry 45. The output of CRC computation circuitry 45 is fed back to the multiplier to multiply with other pre-computed CRCs as needed.

Addition circuitry 52 sums CRC computation circuitry output with the original CRC 60 (102). Addition circuitry 52 produces a recomputed CRC 62. In this way, recomputed CRC 62 is based on the original CRC, the selected set of pre-computed CRCs, the modified portion of the packet, and the corresponding original portion of the packet.

Finally, recomputed CRC 62 and modified packet 64 containing the original CRC are provided as inputs to packet assembly circuitry 66 in order to produce a new packet 68 (104). That is, the recomputed CRC replaces the original CRC at the end of the original packet 64 to produce new packet 68. Data forwarding component 14 may now proceed to forward new packet 68 out network link 20.

Control logic of data forwarding component 14 repeats steps 88-104 in the event multiple portions of the packet (i.e., multiple words) have been changed by the intermediate device 10. In this case, the recomputed CRC from the previous iteration of the steps is used as the original CRC.

Figure 4:
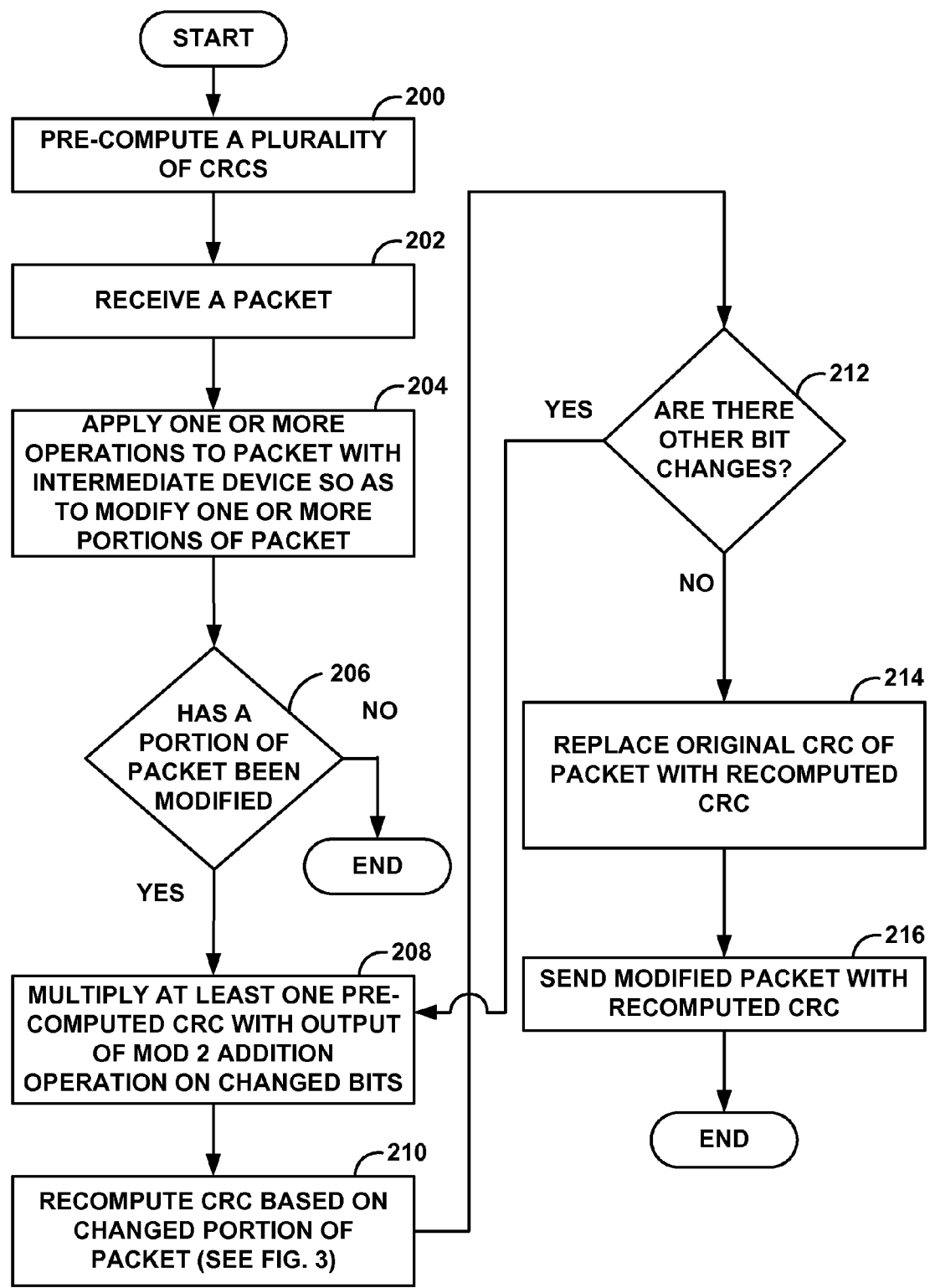
FIG. 4 is a flow diagram illustrating another exemplary method for regenerating a packet CRC in a network device consistent with the principles of the invention.

FIG. 4 is a flow diagram illustrating a simplified version of the method of shown in FIG. 3 for recomputing CRCs for a modified version of a packet. First, a plurality of CRCs is pre-computed (200). A packet is then received (202) by a network device and one or more operations are applied to the packet by the network device that may modify one or more portions of the packet (204). If no portion of the packet has been modified (no branch of 206), no CRC recomputation is needed. If a portion of the packet has been modified (yes branch of 206) then at least one pre-computed CRC is multiplied with the output of the Modulo 2 operation on the bits that have changed to produce a multiplier output (208). Then, the CRC is recomputed based on the changed portion of the packet (210), as seen in FIG. 3. If there are other bit changes to the packet (yes branch of 212), then at least pre-computed CRCs are multiplied together to produce a multiplier output (208) and the CRC is recomputed (210). If there are no other bit changes (no branch of 212), then the original CRC of the packet is replaced with the recomputed CRC (214), and the packet is sent with the modified CRC (216).

The following is a mathematical proof of the CRC calculation technique described above.

Equations 1-9 represent basic truths. All arithmetic operations are based on Modulo 2 arithmetic.

(1) $k = $ order of the $CRC$ polynomial (2) $CRC_p(A) = A$ if $|A| \leq k.|A|$ represents the length (bit width) of $A$ (3) $CRC_p(A + B) = CRC_p(CRC_p(A) + CRC_p(B))$ (4) $\phantom{CRC_p(A + B)} = CRC_p(A) + CRC_p(B)$ (5) $CRC_p(A) + CRC_p(A) = 0$ (6) $CRC_p(A \cdot B) = CRC_p(CRC_p(A) \cdot CRC_p(B))$ (7) $CRC_s(A + B) = CRC_p(CRC_s(A) + CRC_p(B \cdot 2^k)) \forall |A| \geq |B|$ (8) $\phantom{CRC_s(A + B)} = CRC_s(A) + CRC_p(B \cdot 2^k)$ (9) $CRC_s(A) + CRC_s(A) = 0$ Given a message $M_0$, formed by concatenating three bit-strings A, $B_0$, and C, and $CRC_s(M_0)$, the CRC of a new message $M_1$, formed by replacing $B_0$ in $M_0$ with another string $B_1$, may be generated. It is assumed that the length of $B_0$, denoted $|B_0|$, is the same length of $B_1$, denoted $|B_1|$, which shall now be referred to as $|B|$.

Concatenation is accomplished by left shifting and adding the three bit-strings A, $B_0$, and C, and a left shift of i bits is achieved by multiplying by $2^i$, as seen in Eqns. 10-11:

$$M_0 = A \cdot 2^{|B_0|+|C|} + B_0 \cdot 2^{|C|} + C \quad (10)$$

$$M_1 = A \cdot 2^{|B_1|+|C|} + B_1 \cdot 2^{|C|} + C \quad (11)$$

Using the basic truths presented in Eqns. 1-9, the CRC of a message M, concatenated and left shifted, is shown in Eqns. 12-13:

(12) $CRC_s(M) = CRC_s(A \cdot 2^{|B|+|C|} + B \cdot 2^{|C|} + C)$

(13) $\phantom{CRC_s(M)} = CRC_s(A \cdot 2^{|B|+|C|}) + CRC_p(B \cdot 2^{|C|} \cdot 2^k) + CRC_p(C \cdot 2^k)$ The CRC of a message $M_1$ is the CRC of message $M_0$, plus some change $\delta$, as seen in Eqns. 14-15:

$$CRC_s(M_1)=CRC_s(M_0)+\delta \qquad (14)$$

$$\delta=CRC_s(M_1)-CRC_s(M_0) \qquad (15)$$

In Modulo 2 arithmetic, addition and subtraction are the same operation, thus Eqn. 15 may be rewritten as Eqn. 16:

$$\delta=CRC_s(M_0)+CRC_s(M_1) \qquad (16)$$

Using Eqns. 13, and 16 for $M_0$ and $M_1$ along with Eqns. 1-9, $\delta$ may be calculated, as shown in Eqns. 17-18:

$$=CRC_p(B_0 \cdot 2^{|C|}0.2^k)+CRC_p(B_1 \cdot 2^{|C|}0.2^k) \qquad (17)$$

$$=CRC_p(CRC_p(2^{|C|+k}) \cdot CRC_p(B_0+B_1)) \qquad (18)$$

Representing $|C|+k$ as $|Ck|$ Eqn. 18 is rewritten as Eqn. 19:

$$=CRC_p(CRC_p(2^{|Ck|}) \cdot CRC_p(B_0+B_1)) \qquad (19)$$

Any number X may be represented as a string of binary digits $X_i$ in the manner shown in Eqn. 20.

$$X=\Sigma X_i \cdot 2^i \; X_i \in \{0,1\} \qquad (20)$$

If $|Ck|$ is considered as having binary digits $|Ck|_i \in \{0,1\}$, then $CRC_p(2^{|Ck|})$ from Eqn. 19 may be rewritten as shown in Eqns. 21-23.

$$CRC_p(2^{|Ck|})=CRC_p(2^{\Sigma|Ck|_i \cdot 2^i}) \qquad (21)$$

$$=CRC_p(\Pi 2^{|Ck|_i \cdot 2^i}) \qquad (22)$$

$$=CRC_p(\Pi CRC_p(2^{|Ck|_i \cdot 2^i})) \qquad (23)$$

Thus, the $CRC_s(M_1)$ may be written as Eqn. 24-25:

$$CRC_s(M_1)=CRC_s(M_0)+CRC_p(\Pi CRC_p(2^{|Ck|_i \cdot 2^i}) \cdot CRC_p(B_0+B_1)) \qquad (24)$$

$$CRC_s(M_1)=CRC_s(M_0)+CRC_p(\Pi CRC_p(2^{|Ck|_i \cdot 2^i}) \cdot (B_0+B_1)) \text{ if } |B| \leq k \qquad (25)$$

$CRC_p(2^{2^i})$ for all i such that $2^{2^i}<|Ck|$ may be precomputed. Then, the values of $CRC_p(2^{2^i})$ where $|Ck_i|=1$ may be selected, multiplied together with $(B_0+B_1)$, and the CRC of the resulting value may be calculated. Adding this CRC value to $CRC_s(M_0)$ produces $CRC_s(M_1)$.

It should be noted that if $|B_0+B_1|>k$, where k is the order of the CRC polynomial, it may be inconvenient to multiply. However, $|B_0+B_1|$ may be reduced to $CRC_p(B_0+B_1)$ before multiplying. Furthermore, the width of the product will increase by k−1 bits during each iteration, but may be reduced by computing the CRC, as needed.

The following is a numerical example of computing a CRC using the techniques described above. Pre-computed and stored CRCs correspond to values of $2^{2^i}$ for all i such that $2^{2^i}<M$, where M is the Maximum packet length with CRC in bits A number N precomputed CRCs are stored. The technique is storing pre-computed CRCs for $2^{2^0}, 2^{2^1}, 2^{2^2}, 2^{2^3}$ ... etc. The number of CRCs to store depends on the maximum packet size Example Presented immediately below is an example predefined CRC table for the standard Ethernet CRC polynomial having a value of 0x104c11db7. For the Ethernet polynomial, k has a value of 32.

| Value | Precomputed $CRC_p$ |
|---|---|
| $2^{2^5}$ | 4c11db7 |
| $2^{2^6}$ | 490d678d |
| $2^{2^7}$ | e8a45605 |
| $2^{2^8}$ | 75be46b7 |
| $2^{2^9}$ | e6228b11 |
| $2^{2^{10}}$ | 567fddeb |
| ... | ... |

Consider original message $M_0$=01020304__05060708__090a0b0c__0d0e0f00, a 16 byte message, as a concatenation of 3 messages A, $B_0$, and C. A is 4 bytes equal to 32'h01020304, $B_0$ is 4 bytes equal to 32'h05060708, and C is 8 bytes equal to 64'h090a0b0c__0d0e0f00. The $CRC_s$ of $M_0$ is 32'hbe44c1a5. CRC for $M_0$ is calculated by complementing first k bits of $M_0$ and left shifting the resultant by k bits, where k is the order of polynomial. Appending the CRC of $M_0$ to the end of $M_0$ results in a final packet length of 20 bytes.

Now, consider a new message $M_1$ formed by replacing $B_0$ with $B_1$, where $B_1$=32'h05060a0b. The $CRC_s$ of message $M_1$=32'h30554dc9. CRC for $M_1$ is calculated by complementing first k bits of $M_1$ and left shifting the resultant by k bits. $CRC_s(M_1)=CRC_s(M_0)\char`\^ CRC_p(\delta)$. As shown in Eqn. 25 $CRC_s(M_1)=CRC_s(M_0)+CRC_p(\Pi CRC_p(2^{|Ck|_i 2^i}) \cdot (B_0+B_1))$. Because addition in this equation is modulo addition, '+' can be replaced with '^' XOR operation. As such, $B_0\char`\^B_1$=32'h00000d03. And, $|C|$ corresponds to 64 because C is 8 bytes. $|Ck|$ equals to (64+k), where k is the order of the polynomial. Because k is 32 in this example, $|Ck|$=96=110__0000.

Predefined CRCs are to be multiplied corresponding to bit values of '1' in $|Ck|$:
Bit 0 in $|Ck|$—$CRC_p$ of $2^{2^0}$
Bit 1 in $|Ck|$—$CRC_p$ of $2^{2^1}$
Bit 2 in $|Ck|$—$CRC_p$ of $2^{2^2}$
Bit 3 in $|Ck|$—$CRC_p$ of $2^{2^3}$
Bit 4 in $|Ck|$—$CRC_p$ of $2^{2^4}$
Bit 5 in $|Ck|$—$CRC_p$ of $2^{2^5}$
Bit 6 in $|Ck|$—$CRC_p$ of $2^{2^6}$
Bit 7 in $|Ck|$—$CRC_p$ of $2^{2^7}$ etc.

In this example, where $|Ck|$=96=110__0000, bits 5 and 6 of $|Ck|$ are set to '1' and the rest are zero. Thus, $$CRC_p(\delta) = CRC_p\left(\prod CRC_p(2^{|Ck|_i 2^i}) \cdot (B_0+B_1)\right)$$
$$= CRC_p(32'h4c11db7 * 32'h490d678d * 32'h00000d03)$$

Multiplication and computation of the CRC can be implemented in many ways. In this example, 2 operands are multiplied, giving a result of 63 bits. Computing the CRC on 63 bits results in a 32-bit CRC value. The 32-bit CRC is then multiplied with the next 32-bit operand and so on. Pseudo code capable of performing this computation is presented immediately below:

crc_d=$crc_p(B_0\char`\^B_1)$ for (number of operands) {
j=1
mult_resu=operand$_j$*crc_d
crc_d=$crc_p$(mult_res)
j+=1
}
crc_d=$crc_p$(32'h00000d03)=32'h00000d03 because $CRC_p$(A)=A if $|A| \leq k$
For J=1,
mult_res=32'h4c11db7*32'h00000d03=63'h31c0c5f5d9 crc_d=crc$_p$(63'h31c0c5f5d9)=32'h103685fe
For j=2,
mult_res=32'h103685fe*32'h490d678d=63'h49cf4fe09b5f8f6
crc_d=crc(63'h49cf4fe09b5f8f6)=32'h8e118c6c   CRC(δ)= 32'h8e118c6c Thus, the CRC of the modified message M$_1$ according to algorithm is $$CRC(M_1) =$$
$$CRC(M_0) \wedge CRC(\partial) = 32'h\ be44c1a5 \wedge 32'h8e118c6c = 32'h30554dc9$$

Thus, the updated CRC computed using the techniques described herein is equal to the actual CRC of the modified message when computed in its entirety.

Various embodiments of the invention have been described. These and other embodiments are within the scope of the following claims.

The invention claimed is:

1. A network device comprising:
a memory that stores a plurality of pre-computed CRCs;
a set of one or more network interfaces that receives a packet from a network subsequent to the memory storing the plurality of pre-computed CRCs, the packet including an original group of bits and an original cyclical redundancy check (CRC) associated with the original group of bits, wherein none of the plurality of pre-computed CRCs is computed based on the original group of bits of the received packet;
CRC selection circuitry that selects at least one of the plurality of pre-computed CRCs, the CRC selection circuitry being in electrical communication with the memory;
first addition circuitry that receives an original group of bits of the packet and a modified version of the group of bits and performs a first addition operation on the original group of bits and the modified version of the group of bits to produce a first addition operation output, the original group of bits differing from the modified version of the group of bits;
multiplier circuitry that multiplies the selected at least one of the plurality of pre-computed CRCs with the output of the first addition operation on the original group of bits and the modified version of the group of bits, wherein the multiplier produces a multiplier output, and wherein the multiplier is in electrical communication with the memory;
CRC computation circuitry that produces a CRC computation circuitry output from the multiplier output, wherein the CRC computation circuitry is in communication with the multiplier circuitry and the first addition operation circuitry;
second addition circuitry that performs a second addition operation on the CRC computation circuitry output and the original CRC associated with the original group of bits of the packet to output a modified CRC associated with the modified version of the group of bits, the second addition circuitry being in communication with the CRC computation circuitry; and
a forwarding component that updates the original CRC of the packet with the modified CRC and outputs the packet to the network via the set of network interfaces.

2. The network device of claim 1, wherein the original group of bits of the packet is an original packet header and the modified version of the group of bits of the packet is a modified packet header, the original packet header differing from the modified packet header by at least one bit.

3. The network device of claim 2, further comprising:
length computation circuitry that calculates a distance from the at least one bit of the modified packet header to a least significant bit of the packet, the length calculation circuitry being in electrical communication with the CRC selection circuitry,
wherein the CRC selection circuitry selects the at least one of the plurality of pre-computed CRCs from the memory based on the calculated distance.

4. The network device of claim 3, wherein the distance is in bytes.

5. The network device of claim 1, wherein the first addition operation is performed only on the bits that differ between the original group of bits and the modified group of bits.

6. The network device of claim 5, further comprising exclusive or (XOR) circuitry for comparing the original group of bits and the modified group of bits and determining the bits that differ.

7. The network device of claim 1, further comprising:
packet assembly circuitry that assembles the modified CRC with the modified group of bits of the first packet.

8. A method comprising:
subsequent to storing a plurality of pre-computed cyclical redundancy check values (CRCs), receiving a packet with a network device after storing the plurality of pre-computed CRCs, the packet including an original group of bits and an original CRC associated with the original group of bits;
with the network device, selecting at least one of the plurality of pre-computed CRCs wherein none of the plurality of pre-computed CRCs is computed based on the original group of bits of the received packet;
performing a first addition operation on an original group of bits and a modified version of the group of bits to produce a first addition operation output, the original group of bits differing from the modified version of the group of bits;
multiplying the selected at least one of the plurality of pre-computed CRCs with the output of the first addition operation on the original group of bits and the modified version of the group of bits, wherein the multiplier produces a multiplier output;
computing a CRC from the multiplier output;
performing a second addition operation on the computed CRC and the original CRC associated with the original group of bits of the packet to output a modified CRC associated with the modified version of the group of bits;
updating the original CRC of the packet with the modified CRC to form an outbound packet; and
outputting the outbound packet to the network.

9. The method of claim 8, wherein the original group of bits of the packet is an original packet header of the received packet and the modified version of the group of bits of the packet is a modified packet header, the original packet header differing from the modified packet header by at least one bit.

10. The method of claim 9, further comprising:
calculating a distance from the at least one bit of the modified packet header to a least significant bit of the packet, the length calculation circuitry being in electrical communication with the CRC selection circuitry; and
wherein selecting the least one of the plurality of pre-computed CRCs comprises selecting the at least one of the plurality of pre-computed CRCs from the memory based on the calculated distance.

11. The method of claim 10, wherein the distance is in bytes.

12. The method of claim 8, wherein the first addition operation is performed only on the bits that differ between the original group of bits and the modified group of bits.

13. The method of claim 12, further comprising:
comparing, via exclusive or (XOR) circuitry, the original group of bits and the modified group of bits and determining the bits that differ.

14. The method of claim 8, further comprising:
assembling the modified CRC with the modified group of bits of the first packet.

15. The method of claim 8, further comprising:
applying one or more operations to the packet to modify one or more portions of the packet.

* * * * *